(12) United States Patent
Arik et al.

(10) Patent No.: US 7,204,615 B2
(45) Date of Patent: Apr. 17, 2007

(54) LED LIGHT WITH ACTIVE COOLING

(75) Inventors: Mehmet Arik, Niskayuna, NY (US); Todd Garrett Wetzel, Niskayuna, NY (US); Seyed Gholamali Saddoughi, Clifton Park, NY (US); Matthew Patrick Boespflug, Clifton Park, NY (US); James T. Petroski, Parma, OH (US)

(73) Assignee: Lumination LLC, Valley View, OH (US)

( * ) Notice: Subject to any disclaimer, the term of this patent is extended or adjusted under 35 U.S.C. 154(b) by 63 days.

(21) Appl. No.: 10/726,882

(22) Filed: Dec. 3, 2003

(65) Prior Publication Data

US 2004/0190305 A1    Sep. 30, 2004

Related U.S. Application Data

(60) Provisional application No. 60/459,238, filed on Mar. 31, 2003.

(51) Int. Cl.
*F21V 29/00* (2006.01)

(52) U.S. Cl. .................. 362/294; 362/373; 362/800

(58) Field of Classification Search ............ 362/555, 362/800, 294, 373; 310/311, 322, 325, 328, 310/343, 346; 257/88, 706
See application file for complete search history.

(56) References Cited

U.S. PATENT DOCUMENTS

| | | | | | |
|---|---|---|---|---|---|
| 3,464,672 | A | * | 9/1969 | Massa ..................... | 366/115 |
| 4,406,323 | A | * | 9/1983 | Edelman .................. | 165/84 |
| 4,490,649 | A | * | 12/1984 | Wang ...................... | 315/50 |
| 4,498,851 | A | * | 2/1985 | Kolm et al. ............. | 417/410.2 |
| 4,501,319 | A | * | 2/1985 | Edelman et al. ......... | 165/84 |
| 4,503,358 | A | * | 3/1985 | Kamei et al. ............. | 315/58 |
| 4,590,399 | A | * | 5/1986 | Roxlo et al. ............. | 310/334 |
| 4,595,338 | A | * | 6/1986 | Kolm et al. .............. | 416/81 |
| 4,630,182 | A | * | 12/1986 | Moroi et al. ............. | 362/294 |
| 4,667,877 | A | * | 5/1987 | Yao et al. ................. | 239/102.2 |
| 4,763,225 | A | * | 8/1988 | Frenkel et al. ........... | 361/709 |
| 4,780,062 | A | * | 10/1988 | Yamada et al. .......... | 417/410.2 |
| 4,923,000 | A | * | 5/1990 | Nelson .................... | 165/122 |

(Continued)

FOREIGN PATENT DOCUMENTS

EP    0385090 A1 *  1/1990

(Continued)

OTHER PUBLICATIONS

Jelena Vukasinovic and Arl Glezer, Spot-cooling by Confined. Impinging Synthetic Jet, Proceedings of☐☐HT2003, ASME Summer Heat Transfer Conference, Jul. 21-23, 2003, Las Vegas, Neveda, USA.*

(Continued)

*Primary Examiner*—Sandra O'Shea
*Assistant Examiner*—Jason Moon Han
(74) *Attorney, Agent, or Firm*—Fay Sharpe LLP

(57) ABSTRACT

An LED light assembly includes a housing, an LED disposed in the housing, a heat dissipating structure and a fluid current generator. The LED is in thermal communication with the heat dissipating structure and includes a flow path surface. The fluid current generator is disposed in the housing to create a current over the flow path surface.

42 Claims, 10 Drawing Sheets

U.S. PATENT DOCUMENTS

| | | | |
|---|---|---|---|
| 4,941,398 A * | 7/1990 | Morris et al. | 454/285 |
| 5,008,582 A * | 4/1991 | Tanuma et al. | 310/332 |
| 5,089,862 A | 2/1992 | Warner, Jr. et al. | |
| 5,130,912 A * | 7/1992 | Friederichs et al. | 362/263 |
| 5,136,489 A * | 8/1992 | Cheng et al. | 362/294 |
| 5,278,432 A * | 1/1994 | Ignatius et al. | 257/88 |
| 5,335,143 A * | 8/1994 | Maling et al. | 361/694 |
| 5,419,780 A | 5/1995 | Suski | |
| 5,758,823 A * | 6/1998 | Glezer et al. | 239/4 |
| 5,785,418 A * | 7/1998 | Hochstein | 362/373 |
| 5,861,703 A * | 1/1999 | Losinski | 310/330 |
| 5,921,757 A * | 7/1999 | Tsutsui et al. | 417/410.2 |
| 6,008,126 A | 12/1999 | Leedy | |
| 6,020,257 A | 2/2000 | Leedy | |
| 6,045,240 A * | 4/2000 | Hochstein | 362/294 |
| 6,123,145 A * | 9/2000 | Glezer et al. | 165/104.33 |
| 6,252,726 B1 | 6/2001 | Verdiell | 359/820 |
| 6,318,886 B1 * | 11/2001 | Stopa et al. | 362/555 |
| 6,333,852 B1 * | 12/2001 | Lin | 361/697 |
| 6,357,893 B1 * | 3/2002 | Belliveau | 362/285 |
| 6,440,212 B1 | 8/2002 | Hayes | |
| 6,451,175 B1 * | 9/2002 | Lal | 204/173 |
| 6,457,654 B1 * | 10/2002 | Glezer et al. | 239/4 |
| 6,481,874 B2 * | 11/2002 | Petroski | 362/373 |
| 6,511,209 B1 * | 1/2003 | Chiang | 362/373 |
| 6,517,221 B1 * | 2/2003 | Xie | 362/294 |
| 6,541,800 B2 * | 4/2003 | Barnett et al. | 257/98 |
| 6,554,607 B1 * | 4/2003 | Glezer et al. | 431/1 |
| 6,588,497 B1 * | 7/2003 | Glezer et al. | 165/84 |
| 6,770,960 B2 * | 8/2004 | Oohata | 257/678 |
| 6,815,724 B2 * | 11/2004 | Dry | 257/88 |
| 2001/0030866 A1 * | 10/2001 | Hochstein | 362/294 |
| 2003/0075615 A1 | 4/2003 | Saddoughi | |
| 2003/0177899 A1 * | 9/2003 | Monson et al. | 92/98 R |
| 2004/0120148 A1 * | 6/2004 | Morris et al. | 362/264 |

FOREIGN PATENT DOCUMENTS

| | | | |
|---|---|---|---|
| EP | 0 385 090 A1 | | 9/1990 |
| JP | 62-072149 | * | 4/1987 |
| JP | 62072149 | | 4/1987 |

OTHER PUBLICATIONS

Emil Venere, *Enqineers create tiny, wiggling fans to cool future electronics*, Purdue News at☐☐http://news.uns.purdue.edu/UNS/html4ever/011213.Garimella.fans.html.*

Jelena Vukasinovic and Ari Glezer, *Spot-Cooling by Confined Impinging Synthetic Jet*, Proceedings of HT2003, ASME Summer Heat Transfer Conference, Jul. 21-23, 2003, Las Vegas, Neveda, USA.

Emil Venere, *Engineers create tiny, wiggling fans to cool future electronics*, Purdue News at http://news.uns.purdue.edu/UNS/html4ever/011213.Garimella.fans.html.

* cited by examiner

LED LIGHT WITH ACTIVE COOLING

This application claims priority to U.S. provisional patent application Ser. No. 60/459,238 filed Mar. 31, 2003.

BACKGROUND OF THE INVENTION

An LED (light emitting diode) generally includes a diode mounted onto a die or chip. The diode is then surrounded by an encapsulant. The die receives electrical power from a power source and supplies power to the diode. The die can be mounted in a die support. To produce a brighter LED, generally, more power is delivered to the LED.

Many LED lighting systems dissipate heat through a different heat transfer path than ordinary filament bulb systems. More specifically, high power LED lighting systems dissipate a substantial amount of heat via a cathode (negative terminal) leg or through the die attached in a direct die mount device. The conventional heat dissipation systems (i.e. radiating a large percentage of heat to a front lens of a lamp) do not adequately reduce heat in higher power LED systems. Consequently, high power LED systems tend to run at high operating temperatures.

High operating temperatures degrade the performance of the LED lighting systems. Empirical data has shown that LED lighting systems may have lifetimes approaching 50,000 hours while at room temperature; however, operation at close to 90° C. may reduce an LED life to less than 7,000 hours.

To use high brightness LEDs in small lighting footprints, some degree of active cooling can facilitate reducing the temperature of the LED and thus the overall light fixture size since a large heat sink is not necessary. Spot cooling using a fan is known. A known fan includes a flexible diaphragm mounted around its entire periphery to a rigid housing defining an internal chamber. The diaphragm includes an orifice. The diaphragm moves in and out of the internal chamber as it is being actuated by a piezoelectric actuator.

As the diaphragm moves into the chamber, decreasing the chamber volume, fluid is ejected from the chamber through the orifice. As the fluid passes through the orifice, the flow separates at the sharp edges of the orifice and creates vortex sheets which roll up into vortices. These vortices move away from the edges of the orifice under their own self-induced velocity.

As the diaphragm moves out of the chamber, increasing the chamber volume, ambient fluid is drawn into the orifice, and thus into the chamber. Since the vortices are already removed from the edges of the orifice, they are not affected by the ambient fluid being entrained into the chamber. As the vortices travel away from the orifice, they synthesize a jet of fluid, a "synthetic jet," through entrainment of the ambient fluid. It is these fans or synthetic jet generators that have been found useful in cooling electronic packages.

Known piezoelectric fans and synthetic jet actuators have relatively limited capacity, in that they use only a single moving element or a moving element of limited deflection. It would be desirable to increase the performance of an LED assembly by providing an active cooling system that overcomes the above mentioned shortcomings.

BRIEF SUMMARY OF THE INVENTION

An LED light assembly includes a housing, an LED disposed in the housing, a heat dissipating structure and a fluid current generator. The LED is in thermal communication with the heat dissipating structure, which includes a flow path surface. The fluid current generator is disposed in the housing to create a current of fluid over the flow path surface.

BRIEF DESCRIPTION OF THE DRAWINGS

The drawings are only for purposes of illustrating preferred embodiments and are not to be construed as limiting the invention, which is defined by the appended claims.

DETAILED DESCRIPTION OF THE INVENTION

Figure 1:
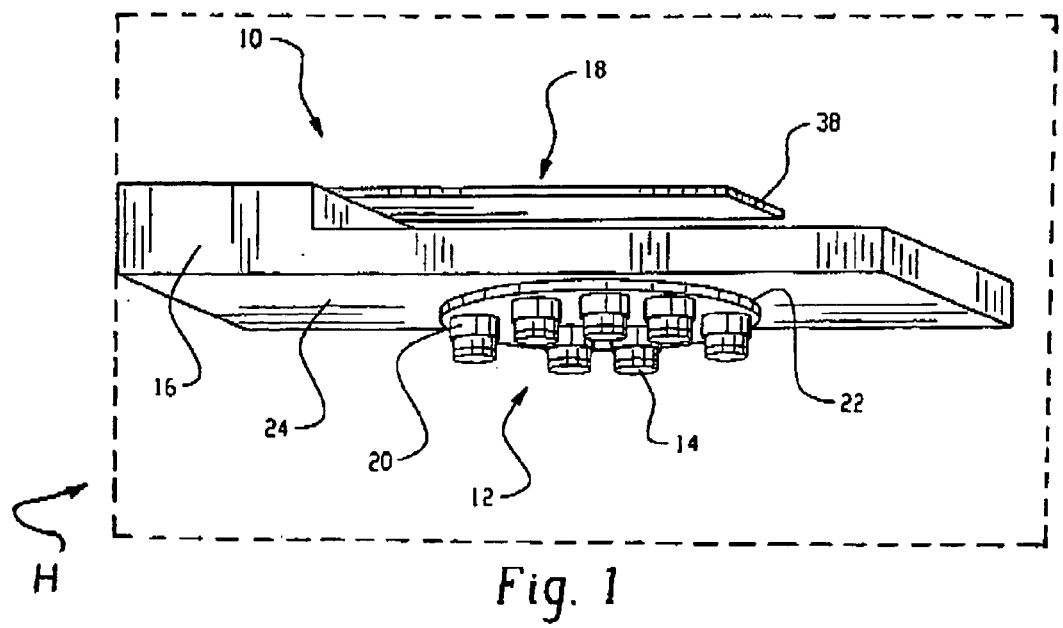
FIG. 1 illustrates a side perspective view of a portion of an LED lamp device having a heat dissipation system.

With reference to FIG. 1, a portion 10 an LED light assembly includes an LED array 12 made up of a plurality of LEDs 14 secured to a heat dissipating structure 16 that has a fan 18 mounted to it. The term "fan" is not limited to only a device for creating a current of air or a machine using a motor to rotate vanes to move air. The term "fan" is more broadly used to describe a device for creating a current of fluid, not limited to only air. The portion 10 of the LED assembly can be covered by a translucent cover (not shown) and/or situated in a fixture or housing H to create the LED assembly. Each LED 14 includes a die (not visible) that receives electrical power from a power source (not shown) and supplies the power to the LED 14. The die is received in a die support 20. Heat that is generated by the LED is transferred to the heat dissipating structure 16 via the die.

The mounting of the LED and the electrical connections used to supply power to the LED are known in the art, and therefore need no further description. The LEDs 14 can be conventional LEDs that are known in the art. The LEDs 14 are mounted on a mounting plate 22. The mounting plate 22, and thus the LED array 12, is mounted to a first surface or under surface 24 of the heat dissipating structure 16.

Figure 2:
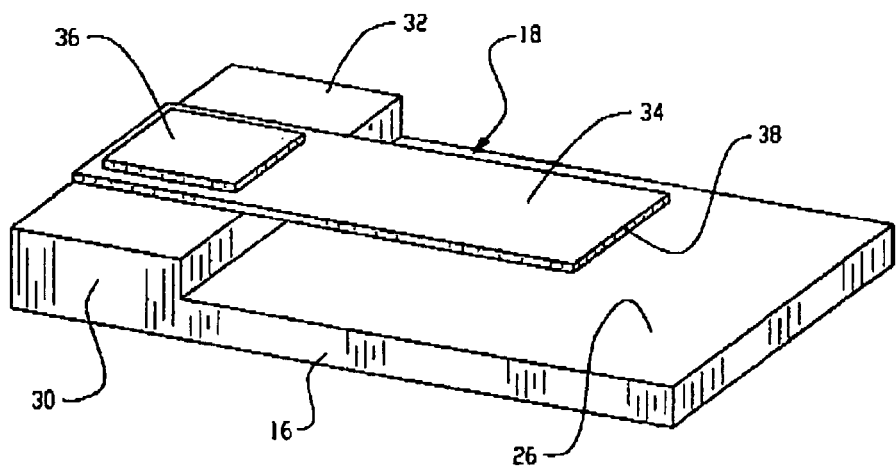
FIG. 2 illustrates a top perspective view of the LED lamp device of FIG. 1.

With reference also now to FIG. 2, the heat dissipating structure 16 includes the under surface 24 and a second or upper surface 26, which acts as a fluid flow path surface for dissipating the heat generated by the LEDs 14. The upper surface provides a heat dissipating surface over which a fluid, most likely air, will flow to facilitate heat dissipation. The heat dissipating structure 16 can be a separate thermally conductive piece of an LED light fixture (not shown) in which the portion 10 of the LED light assembly will be mounted, or it can be an integral thermally conductive piece with one of the components of the LED light fixture. The heat dissipating structure can also include a structure to which the LED mounts, including a printed circuit board or similar structure.

A pedestal 30 extends upwardly from and normal to the upper surface 26 of the heat dissipating structure 16. The pedestal 30 is the same width as the heat dissipating structure 16; however, the pedestal need not be the same width as the heat dissipating structure. The pedestal 30 has a pedestal surface 32 on which the fan 18 is mounted. The pedestal surface 32 is spaced from the upper surface 26 an adequate amount to allow the fan 18 to flap. Accordingly, the length and characteristics of the fan can limit the difference in elevation between the pedestal surface 32 and the upper surface 26, and vice versa. The pedestal 30 can be solid, in that it does not contain any passages through which fluid can flow between the upper surface 26 and the fan 18, at the point of attachment between the fan and the pedestal. Similarly, the pedestal 30 can also be hollow and the walls that depend from the upper surface 26 can prevent fluid flow at the point of attachment between the fan and the pedestal. In FIGS. 1 and 2, the pedestal 30 is located at an end of the heat dissipating structure 16. Alternatively, the pedestal 30 can be more centrally located on the heat dissipating structure 16. In this alternative, a fan or a plurality of fans can cantilever off each side of the pedestal 30 and, thus, over the upper surface 26. The fan 18 is shown mounted to a central portion of the pedestal 30; however, the fan 18 can mount elsewhere on the pedestal.

As stated earlier, the heat generated by the LEDs 14 is transferred through thermal conduction to the heat dissipating structure 16. To cool the heat dissipating structure 16, air or some other fluid is moved over and around the surfaces of the heat dissipating structure. The fan 18 facilitates the movement of such fluid over the heat dissipating structure 16.

The fan 18 includes a blade 34 attached to a piezoelectric material 36. The blade is made of a flexible material, preferably a flexible metal. An unattached end 38 of the blade 34 cantilevers away from the pedestal 30 and over the upper surface 26. The blade mounts to the pedestal surface 32 such that the unattached end 38 of the blade 34 does not contact the upper surface 26 when the blade is moving. The piezoelectric material 36 attaches to the blade 34 opposite the unattached end 38 and over the pedestal 30. Alternatively, the piezoelectric material 36 can run the length, or a portion of the length, of the blade 34. The piezoelectric material 36 comprises a ceramic material that is electrically connected to a power source (not shown) in a conventional manner. As electricity is applied to the piezoelectric material 36 in a first direction, the piezoelectric material expands, causing the blade 34 to move in one direction. Electricity is then applied in the alternate direction, causing the piezoelectric material 36 to contract and moving the blade 34 back in the opposite direction. The alternating current causes the blade 34 to move back and forth continuously.

In FIGS. 1 and 2, the fan is mounted directly to the heat dissipating structure 16. Alternatively, the fan 18 can mount to another component of the light assembly or light fixture. In this alternative, the fan 18 mounts to a portion of the light assembly near the heat dissipating structure 16 so that the fan can generate an airflow around the exterior surfaces of the heat dissipating structure. Furthermore, the fan 18 in FIGS. 1 and 2 is mounted such that the blade 34 moves up and down; however, a fan can mount such that it moves side to side, or in another axis, for example diagonally.

During operation of the LED light assembly, each LED 14 generates heat. The LED 14 includes a die (not visible) that allows conduction of the heat generated by the LED 14 to the heat dissipating structure 16. Meanwhile, an alternating current is supplied to the piezoelectric material 36 causing the blade 34 to move up and down, which results in a fluid current moving around the heat dissipating structure 16. The flow of fluid around the heat dissipating structure 16 cools the heat dissipating structure more quickly than with no moving fluid. Accordingly, more heat can be dissipated from the LED 14 resulting in a lower operating temperature. Furthermore, the footprint of the LED light can be reduced because the size of the heat dissipating structure can be reduced due to the active cooling caused by the fan. Also, a quiet active cooling takes place because the fan does not generate a lot of noise, which would be unattractive to consumers.

Figure 3:
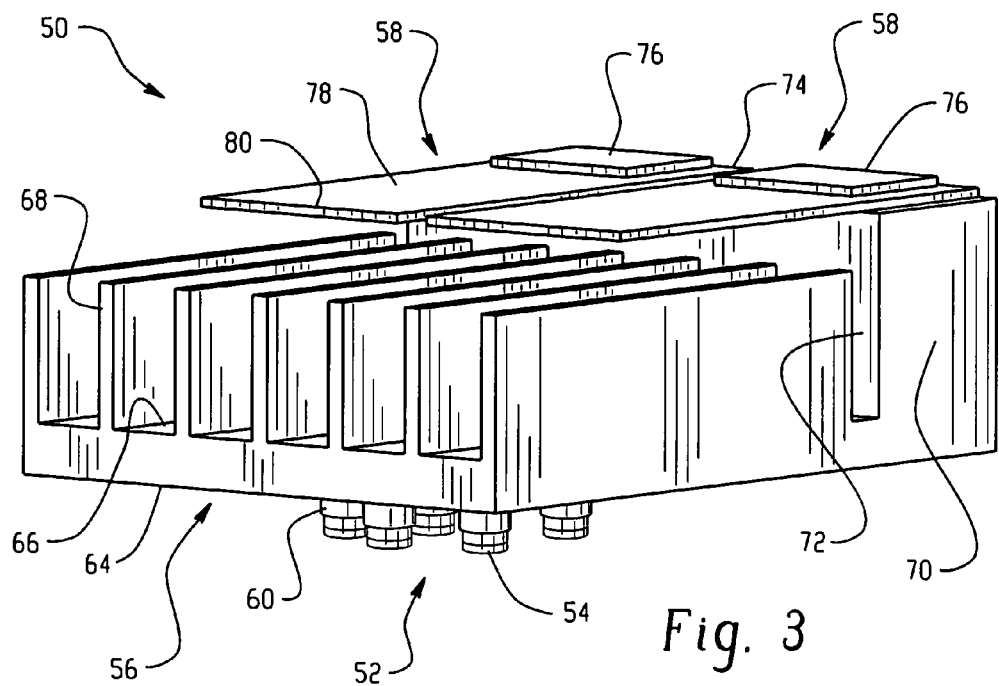
FIG. 3 illustrates a side perspective view of a portion of an LED lamp device having an alternative heat dissipation system.

With reference now to FIG. 3, a portion 50 of an LED lighting assembly is disclosed. The LED lighting assembly includes an LED array 52 made up of a plurality of LEDs 54 mounted to a heat dissipating structure 56. A pair of fans 58 mounts to the heat dissipating structure 56. Alternatively, only one fan can mount to the heat dissipating structure or a plurality of fans can mount to the heat dissipating structure. Each LED 54 is similar to the LED 14 described above with reference to FIGS. 1 and 2. Each LED 54 mounts in an LED die support 60. Heat generated by LED 54 is transferred to the heat dissipating structure 56 through a die (not visible) that is mounted inside the die support 60. This embodiment can also include a mounting plate (not visible) similar to the mounting plate 22 described above with reference to FIGS. 1 and 2.

The heat dissipating structure 56 includes a first or lower surface 64 to which the LED array 52 is mounted. The heat dissipating structure 56 also includes a second or upper surface 66 opposite the lower surface 64. Fins 68 project upwardly substantially normal to the plane of the upper surface 66. The upper surface 66 and the surface area of the fins 68 provide a flow path surface over which a fluid, most likely air, will flow to facilitate heat dissipation. The fins 68 increase the surface area of flow path surface.

The heat dissipating structure 56 also includes a pedestal 70 projecting upwardly from the upper surface 66 of the heat dissipating structure 56. The pedestal 70 also projects upwardly substantially normal to the plane of the upper surface 66 away from the lower surface 64. The pedestal 70 is similar to the pedestal 30 described with reference to FIGS. 1 and 2. The pedestal 70 is spaced from the fins 68 such that a gap 72 is defined between an end of each of the fins and the pedestal. The pedestal 70 includes a pedestal surface 74 that is elevated above the fins 68.

Figure 4:
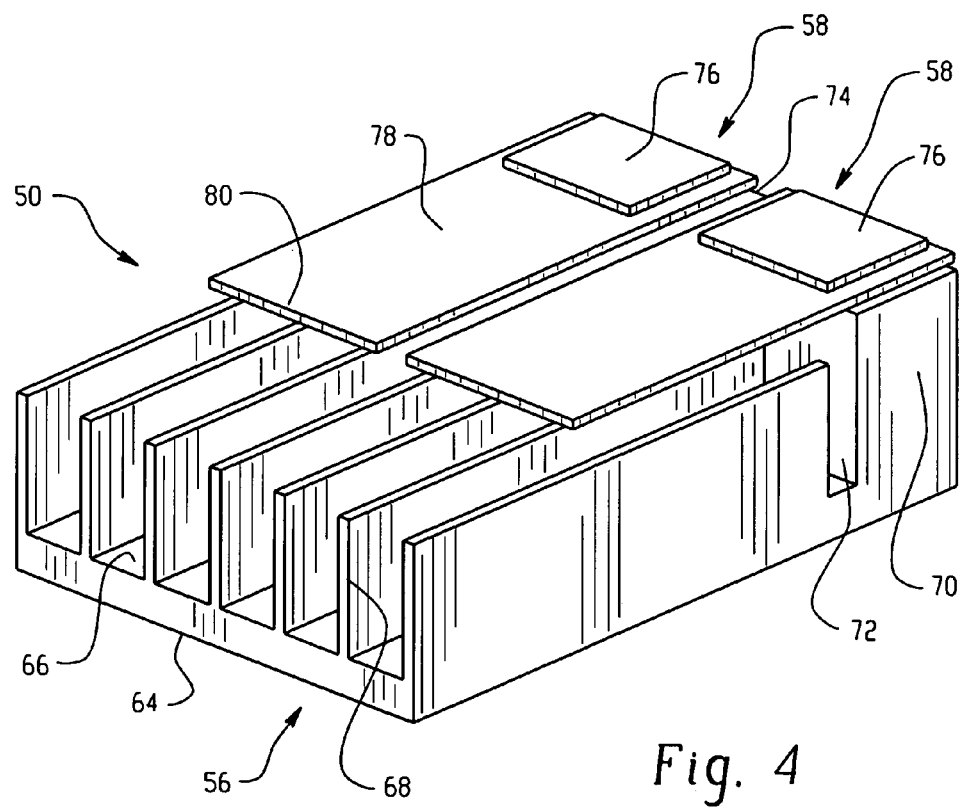
FIG. 4 illustrates a top perspective view of the LED lamp device of FIG. 3.

Referring also to FIG. 4, fans 58 are mounted on the pedestal surface 74. Each fan 58 includes piezoelectric material 76 and a blade 78. Each fan is similar to the fan 18 described above with reference to FIGS. 1 and 2. An unattached end 80 of each blade 78 cantilevers away from the pedestal 70 and over the fins 68. Each blade 58 is spaced from the each of the fins 68 so that when each blade 78 moves up and down the unattached end 80 does not contact the fins. Also, the pedestal 70 can extend upwardly where the fans 58 are disposed between the fins 68, as opposed to over the fins. Similar to the fan 18 shown in FIGS. 1 and 2, each fan 58 has the piezoelectric material 76 attached to the blade 78 opposite the unattached end 80 and over the pedestal 70.

Figure 5:
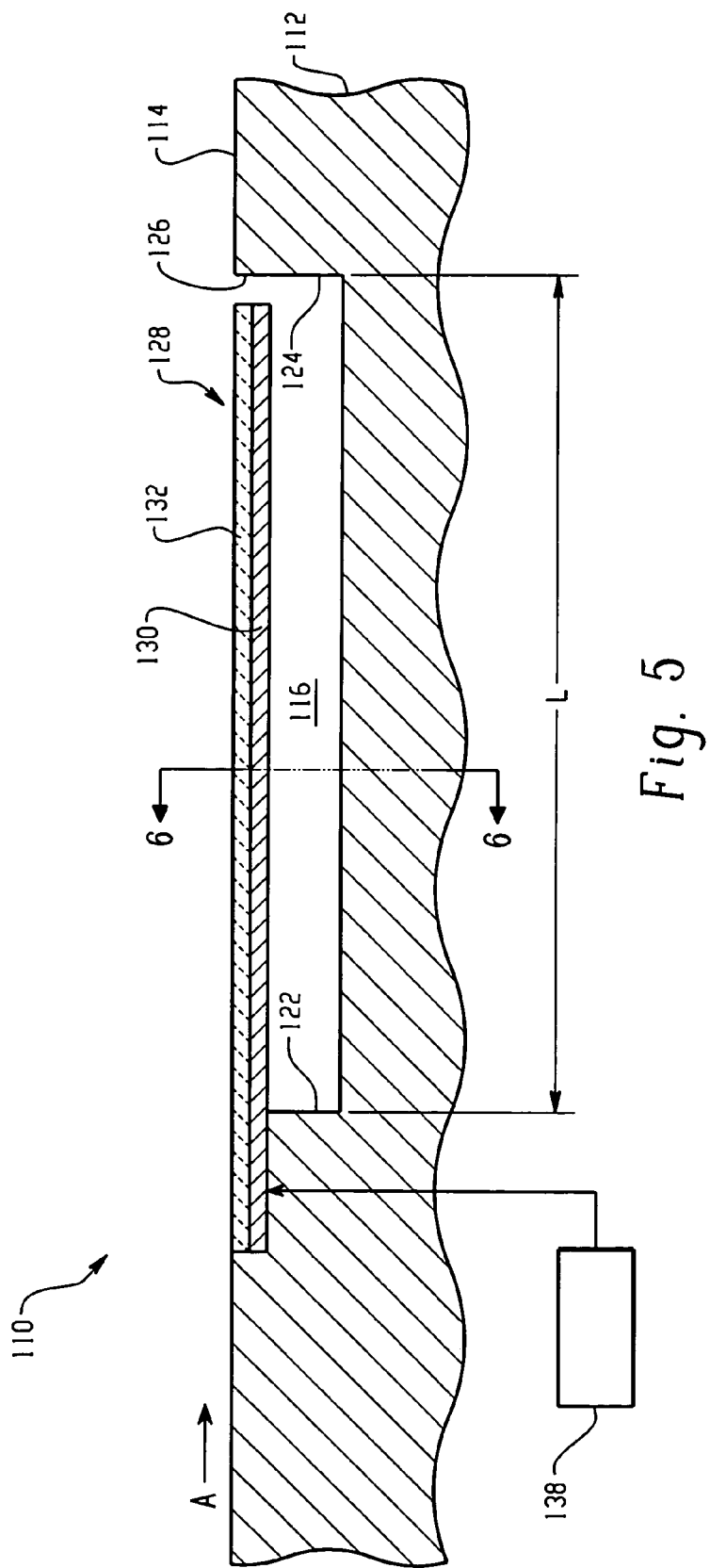
FIG. 5 illustrates a schematic sectional side view of an alternative heat dissipation system for an LED lamp device.

With reference to FIG. 5, a current generator 110 is disposed in a wall 112. The current generator creates a substantially vortex-shaped current; however, the current generator is not limited to creating a substantially vortex-shaped current, but should be construed to include any device that can create a fluid current of any configuration. The wall 112 can form a portion of the heat dissipating structure of an LED light assembly described with reference to FIGS. 1–4. The wall 112 can also include the structure to which an LED is mounted, such as a printed circuit board. The wall includes a flow path surface 114 over which fluid circulates to cool the wall.

A generally rectangular cavity 116 having a depth D (FIG. 6), width W (FIG. 6), and length L is formed in the wall 112. The cavity 116 has a pair of spaced-apart generally parallel side walls 118 and 120 (FIG. 6) and a pair of spaced-apart generally parallel end walls 122 and 124. The walls define an opening 126 in the flow path surface 114. The opening 126 of the cavity 116 is covered by a flexible, generally rectangular actuator blade 128.

Figure 6:
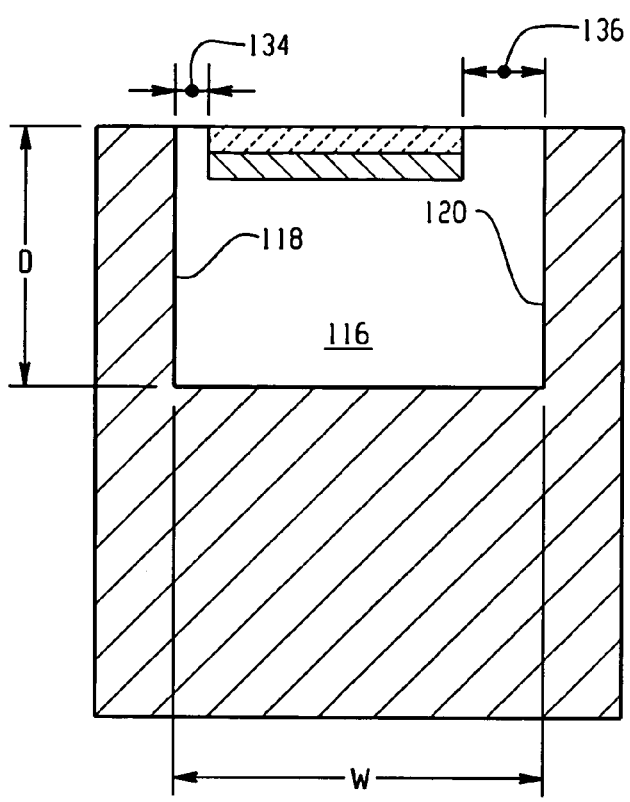
FIG. 6 illustrates a cross-sectional view taken along lines 6—6 of FIG. 5.

The blade 128 is attached to the wall 112 by a cantilever support at first end of the cavity 116. Alternatively the blade 128 could also attach to the wall 112 an opposite end of the cavity 116. The blade 128 can attach to the wall 112 in any conventional manner, for example with an adhesive or fasteners. The blade 128 includes two layers: a flexible layer 130 formed from a flexible material, such as stainless steel or aluminum, and a piezoelectric layer 132 attached to the flexible layer 130 and formed from a piezoelectric material, for example piezoceramic. The piezoelectric layer 132 is disposed closest to the flow path surface 114; however, the piezoelectric layer 132 can be disposed opposite the flow path surface. Although the illustrated example shows a single piezoelectric layer 132, a second layer piezoelectric layer can attach to the opposite side of the blade 128, so that the flexible layer 130 would have a piezoelectric layer on each side. The layers 130 and 132 are securely bonded to each other, for example by the use of an adhesive layer. Also the layers 130 and 132 are substantially the same length. As seen in FIG. 6, the width of the blade 128 is less than the width W of the cavity 116. As seen in FIG. 5, the length of the portion of the blade 128 extending over the cavity 116 is slightly less than the length L of the cavity 116 to provide an operating clearance. The length L of the cavity 116 (and thus the length of the blade 128) can be varied, although the shorter the blade and/or cavity become, the smaller the tip deflection of the blade 128 and thus the lower the effectiveness of the current generator 110.

In one embodiment the length L of the cavity can be about 10 inches. This is significantly larger than known similar devices. The blade 128 is installed in an off-center position relative to the cavity 116 such that two unequal side gaps 134 and 136 are created between the edges of the blade 128 and the side walls 118 and 120 of the cavity 116. The blade 128 is also connected to a controllable electric source 138 (depicted schematically in FIG. 5) to supply an alternating voltage of the desired magnitude and frequency to the blade 128.

In operation, an alternating voltage is applied to the blade 128 from the controllable source. When a potential is applied across the piezoelectric layer 132, the layer 132 either expands or contracts depending upon the polarity of the voltage. Since the piezoelectric layer 132 is bonded to the flexible layer 130, the application of the alternating voltage induces a bending strain resulting in oscillation of the blade 128.

In one example, a blade 128 approximately 25.4 cm (10 in.) long, 25.4 mm (1 in.) wide, and 3.43 mm (0.135 in.) thick, having a flexible layer 130 of stainless steel 3.18 mm (0.125 in.) thick was constructed. When a 75 Hz, 200V RMS sinusoidal input signal was applied, the peak-to-peak tip deflection at the unattached end of the blade 128 was approximately 1.27 mm (0.5 in.). This tip deflection is somewhat greater than prior art devices and increases the capacity of the current generator 110. Furthermore, the use of a piezoceramic actuator has advantages over other known types of actuators, such as mechanical actuators, particularly in that it may be reliably operated at higher frequencies, for example about 70–80 Hz, which further increases the effectiveness of the current generator 110. A mechanically actuated device has problems operating at these frequencies because it tends to distort the blade into a sinusoidal mode shape, which interferes with the creation of the desired vortex patterns. The piezoelectrically actuated blade 128 of this example does not experience this problem.

Figure 7:
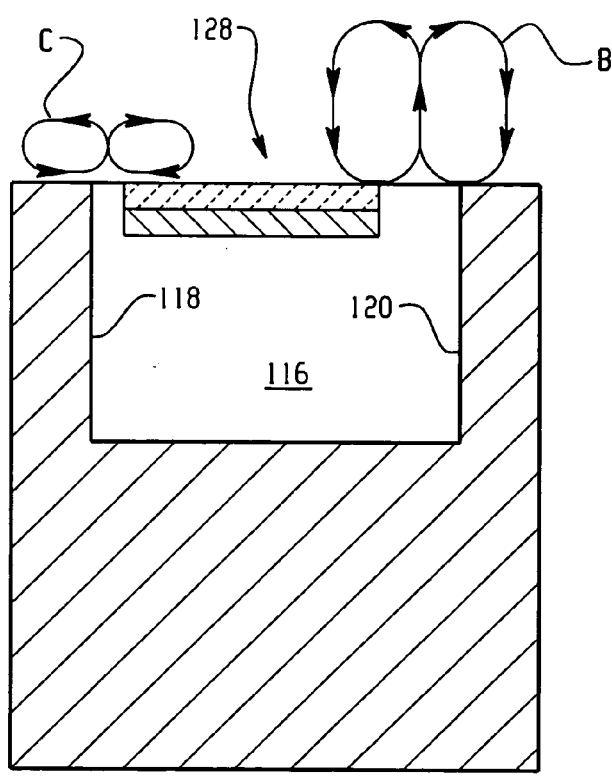
FIG. 7 illustrates a cross-sectional view similar to that of FIG. 6.

In operation, as the blade 128 moves outward with respect to the cavity 116, increasing the cavity volume, ambient fluid is drawn from large distances from the large side gap 136 into the cavity 116. On the subsequent down stroke, the blade 128 moves downward into the cavity 116, decreasing the cavity volume and expelling fluid from the cavity through the large side gap 136. As shown in FIG. 7, this alternating "pull" and "push" of the blade 128 results in a vortex flow pattern above the large side gap 136, illustrated by arrow B. A similar flow pattern, to a lesser degree, is created above the narrow side gap 134, illustrated by arrow C. The larger side gap 136 forms the primary passage for fluid into and out of the cavity 116, while the narrow side gap 134 primarily creates a space for operating clearance of the blade 128 as it oscillates. In the case where the flow over the surface of the wall 112 is opposite to the direction of arrow A, there is an additional benefit in that when the current generator blade is extended outward, it acts as a conventional vortex generator protruding from the surface, helping to prevent flow separation. Also the end wall 124 prevents axial current flow below the flow path surface 114.

Figure 8:
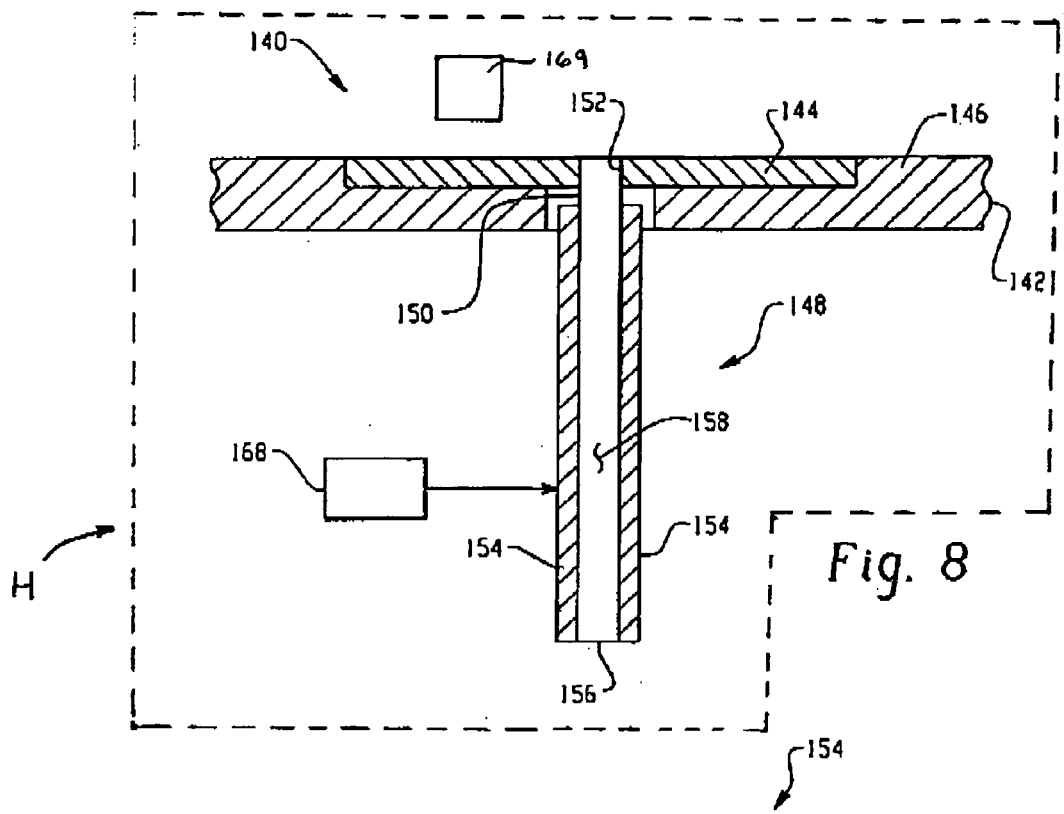
FIG. 8 illustrates a schematic sectional side view of an alternative heat dissipation system for an LED lamp device.

Referring to FIG. 8, a synthetic jet actuator 140 is disposed in a wall 142, which can be found in a housing H. The synthetic jet also generates a current similar to the fan and the current generator described above. A current generator body 148 is attached to an orifice plate 144 by a discharge conduit 150, which is an extension of a flexible hinge 156, described below. The orifice plate 144 is disposed in the wall 142 flush with a flow path surface 146. The interior of the current generator body communicates with the flow path surface 146 of the wall 142 through one or more orifices 152 in the orifice plate 144.

The current generator body 148 is constructed from a pair of side plates 154 that are connected by the flexible hinge 156. The plates 154 are spaced apart from each other and are disposed in a generally parallel relationship. The flexible hinge 156 surrounds the periphery of each plate 154 and can overlap the edges of the plates 154. The hinge 156 holds the side plates 154 together. An internal fluid cavity 158 is thus enclosed by the side plates 154 and the hinge 156. Each side plate 154 can be a circular disk or other shapes, for example rectangular. This arrangement is similar to a bellows. The hinge 156 can be constructed from any flexible, fluid-tight material. The hinge can also be made of a material that is suitable as an adhesive, for example a room temperature vulcanizing (RTV) material.

Figure 12:
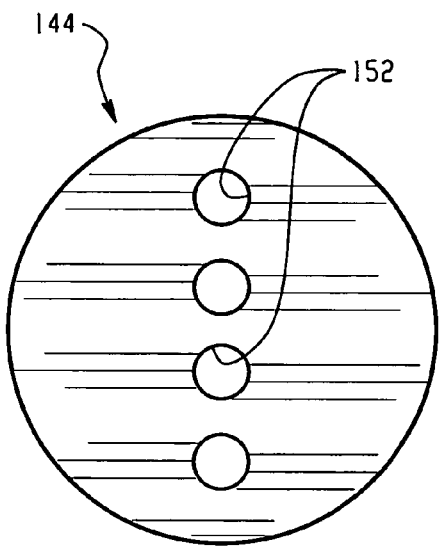
FIG. 12 illustrates a top plan view of an orifice plate.
Figure 13:
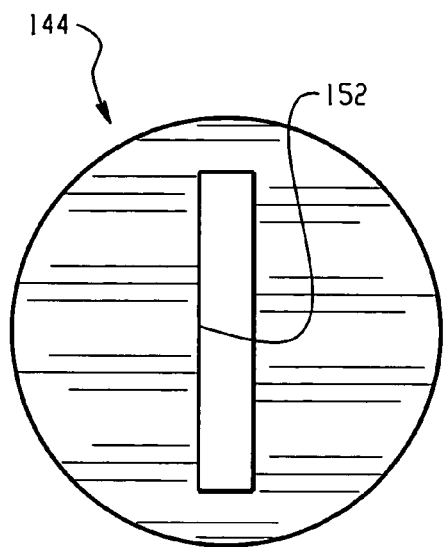
FIG. 13 illustrates a top plan view of an alternative orifice plate.

The orifices 152 may be a series of holes as shown in FIG. 12, or may take the form of an elongated slot, as shown in FIG. 13. The size, shape, number and angle of the orifices 152 can be modified in order to suit a particular application, for example the orifices 152 can be angled in a downstream direction (pitch angle), or the array of orifices 152 can be angled in the plane of the orifice plate 144 (yaw angle).

Figure 9:
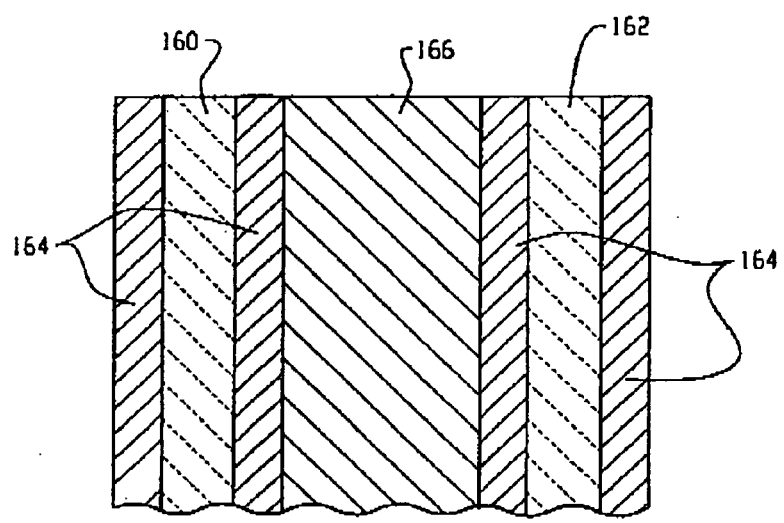
FIG. 9 illustrates a detailed view of one of the side plates of FIG. 8.

Referring to FIG. 9, each side plate is formed from a plurality generally planar stacked layers. Each side plate 154 forms a bimorph piezoelectric structure; each side plate comprises two piezoelectric layers 160 and 162 having opposite polarities. The piezoelectric layers 160 and 162 are made of a piezoceramic material. When a voltage is applied to the bimorph piezoelectric structure, one layer 160 expands while the other layer 162 contracts due to the opposite-facing polarities. Since the piezoelectric layers 160 and 162 are parallel to each other, the application of a voltage causes the side plate 154 to take up a roughly hemispherical shape, in the case of circular side plates. When a voltage of opposite polarity is applied, the side plate 154 bends in the opposite direction (i.e. concave instead of convex). This arrangement in effect doubles the force exerted for a given voltage compared to a single piezoelectric layer.

The piezoelectric layers 160 and 162 are covered on each side with a thin protective cladding layer 164 to prevent cracking of the piezoelectric layers 160 and 162. In an exemplary embodiment the cladding layers 164 are made of stainless steel, preferably very thin, and are attached to the piezoelectric layers 160 and 162 with a suitable adhesive. The piezoelectric layers 160 and 162 with the attached cladding layers are attached to opposite sides of a central layer referred to as a shim 166, for example with an adhesive layer. The shim 166 material and thickness is selected for sufficient stiffness to place the operating frequency of the actuator body 148 in the desired range. In the illustrated example, the shim 166 is made of aluminum. The side plates 154 are connected to a controllable electric source 168 (shown schematically in FIG. 4) so that an alternating voltage of the desired magnitude and frequency may be applied to the blade side plates 154.

In operation, voltage from the electric source is applied to the side plates 154 so as to cause the plates to deflect in opposite directions to each other. That is, when the left-hand side plate 154 illustrated in FIG. 9 is deflected convexly to the right, the right-hand side plate 154 is deflected convexly to the left. This simultaneous deflection reduces the volume of the fluid cavity 158 and causes fluid to be expelled through the discharge conduit 150 and then from the orifice 152. When voltage of opposite polarity is applied, the side plates deflect in the opposite direction. This action increases the volume of the fluid cavity 158 and causes a decreased partial pressure in the fluid cavity 158, which in turn causes fluid to enter the fluid cavity 158 through the orifice 152. Since each side plate 154 is a bimorph piezoelectric structure, and there are two side plates, this embodiment of the present invention has four times the capacity of a single piezoelectric device of the same overall dimensions. Fluid can expelled from the orifice 152 in a multitude of directions by simply changing the orientation and/or configuration of the plates, the flexible hinge or the orifice. Furthermore, the synthetic jet actuator 140 can be used to directly cool an LED die 169 that does not include a heat sink or a larger heat dissipating structure.

Figure 10:
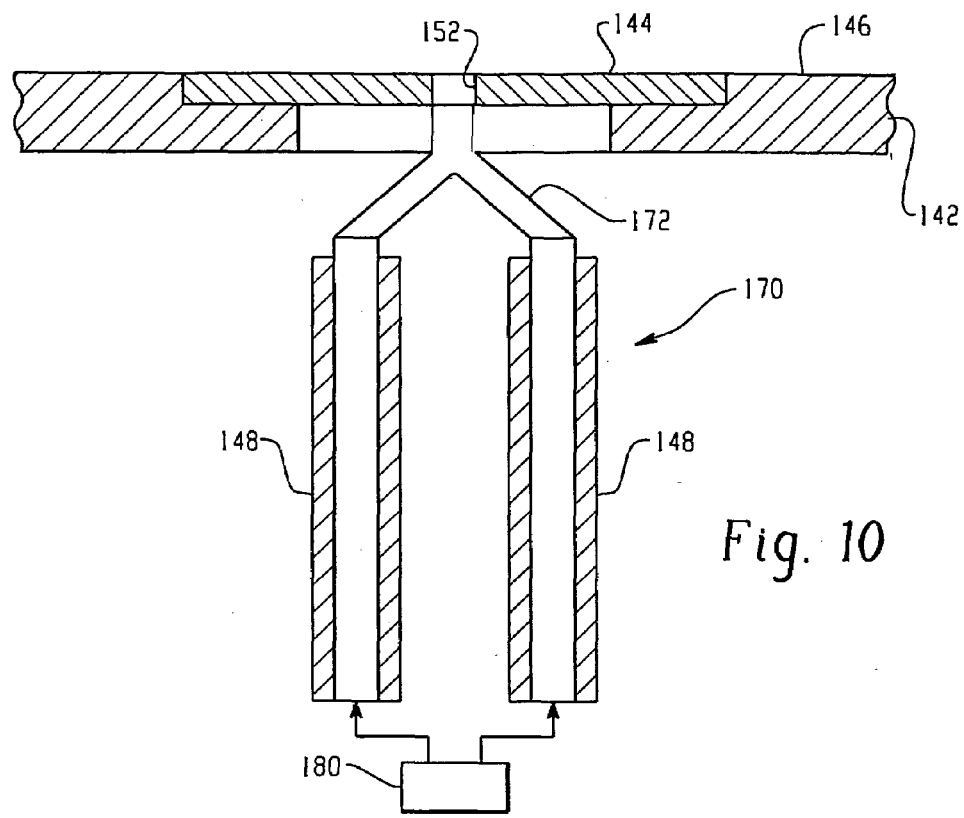
FIG. 10 illustrates a schematic sectional side view of an alternative heat dissipation system for an LED lamp device.
Figure 11:
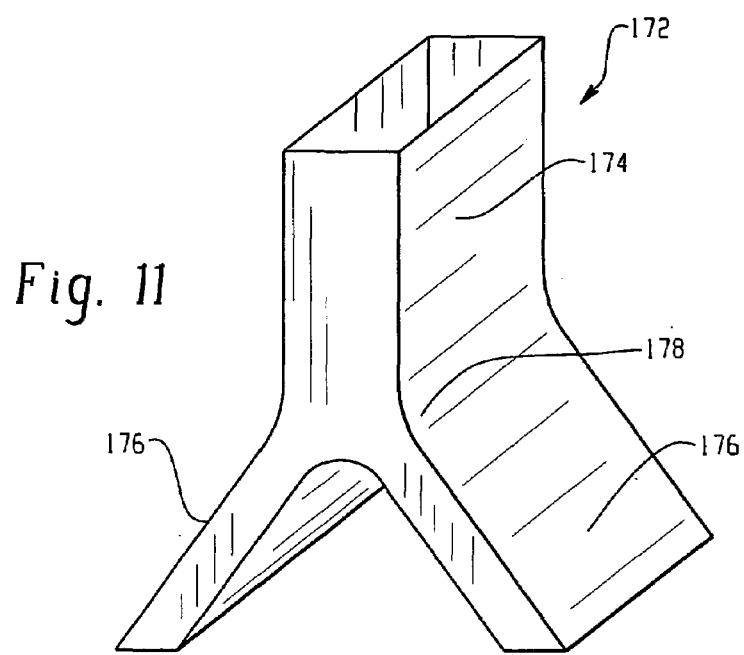
FIG. 11 illustrates a perspective view of a discharge conduit.

The output of two or more of the current generator bodies 148 can be combined into a single discharge area. As seen in FIG. 10, a synthetic jet actuator 170 comprises, for example, a pair of current generator bodies 148 disposed adjacent a wall 142. A discharge conduit 172 having a generally inverted Y-shape connects the two current generator bodies 148. The conduit 172 is shown in more detail in FIG. 11. The conduit 172 is hollow and has an outlet leg 174 connected to two inlet legs 176 at a junction 178. The outlet leg 174 of the conduit 172 communicates with the flow path surface 146 of the wall 142 through one or more orifices 152 in the orifice plate 144. The orifices 152 may be a series of holes, as shown in FIG. 12, or may take the form of an elongated slot as shown in FIG. 13. The size, shape, number and angle of the orifices 152 may be modified in order to suit a particular application. The orifices 152 may also be arranged in the pattern illustrated in FIGS. 14 and 15, as described in more detail below. With reference back to FIG. 10, the current generator bodies 148 are connected to a controllable electric source 180 (shown schematically). It should be noted that it is possible to use one power source 180 for multiple current generator bodies 148 connected in series, because each current generator body 148 has a low power consumption. This variation of the invention provides further increased capacity from a single orifice plate.

Figure 14:
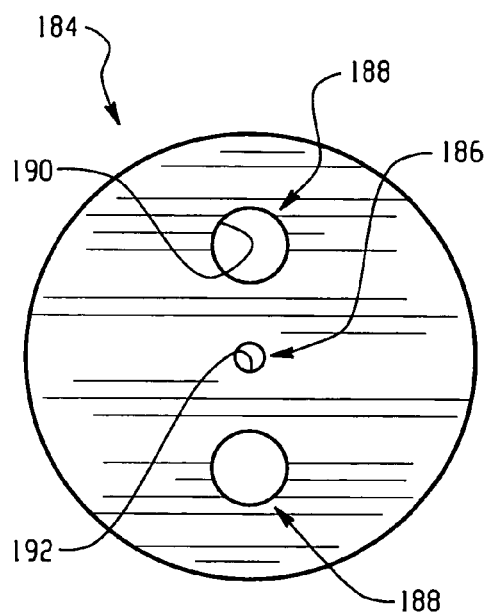
FIG. 14 illustrates a top plan view of an alternative orifice plate.
Figure 15:
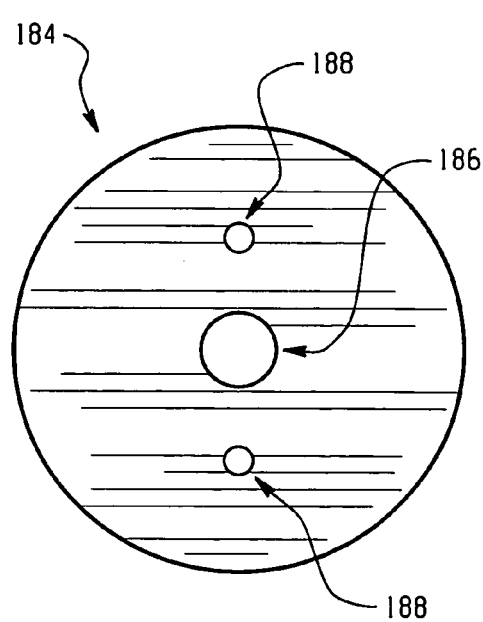
FIG. 15 illustrates a bottom plan view of the orifice plate of FIG. 14.

An alternative orifice plate 184 is illustrated in FIGS. 14 and 15. FIG. 14 illustrates the side facing the flow path surface 146, and FIG. 15 illustrates the side facing the fluid cavity 158 of the current generator body 148. The orifice plate 184 has a central hole 186 and side holes 188 disposed on either side of the central hole 186. Each of the holes has a conical or nozzle-like profile, so that the hole inlet 190 is larger in diameter than the hole outlet 192. The central hole 186 is disposed so that the inlet 190 is on the side of the orifice plate 184 facing the fluid cavity 158 (FIG. 14) of the current generator body 148, while the two side holes 188 face the opposite direction. Since the holes have a lower resistance to flow in the direction from the inlet 190 to the outlet 192 than in the opposite direction, this arrangement tends to make air going inward to the fluid cavity 158 flow through the two side holes 188, while flowing outward from the fluid cavity 158 tends to flow though the central hole 186. This increases the velocity of the air flow out of the fluid cavity 158 which increases the effectiveness of the synthetic jet actuator 140.

Figure 16:
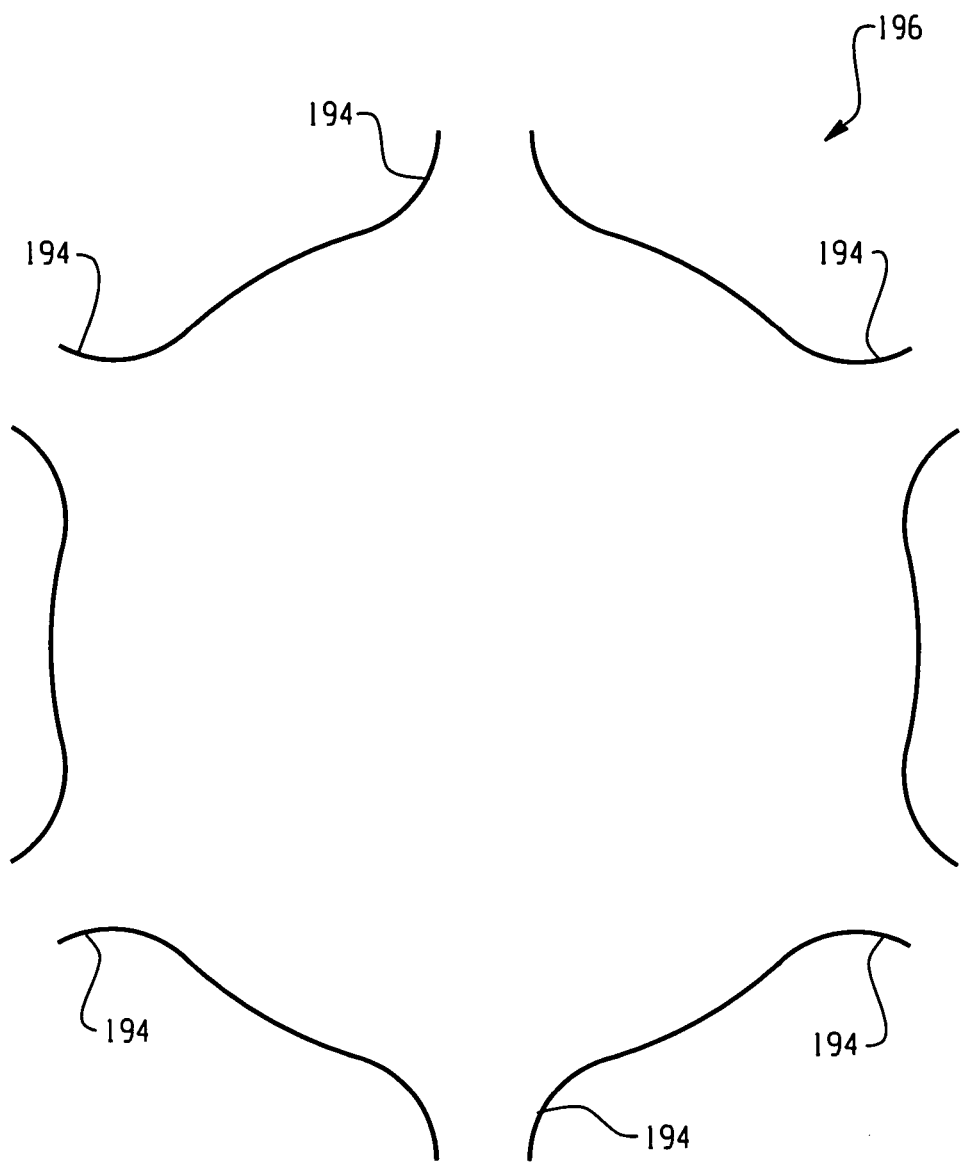
FIG. 16 illustrates a multiple outlet arrangement for a heat dissipation system.

As an alternative to the arrangement illustrated in FIG. 8, the current generator body 148 can be provided with more than one outlet. For example, with reference to FIG. 16, a plurality of discharge conduits 194 may be arranged around the periphery of a current generator body. FIG. 16 depicts how these additional discharge conduits 194 could be incorporated into a flexible hinge 196, which is seen from the side in FIG. 16. The number of discharge conduits 194 is only limited by the physical space available. Although the outlet velocity is reduced by adding additional discharge conduits 194, the outlet velocity is not reduced in proportion to the number of additional discharge conduits 194. For example, testing has shown that a current generator body 148 having 6 outlets still produces about 90% of the outlet velocity of the same current generator having a single outlet. In other words, a single current generator body 148 could be used to produce output for a number of orifices 152.

Figure 17:
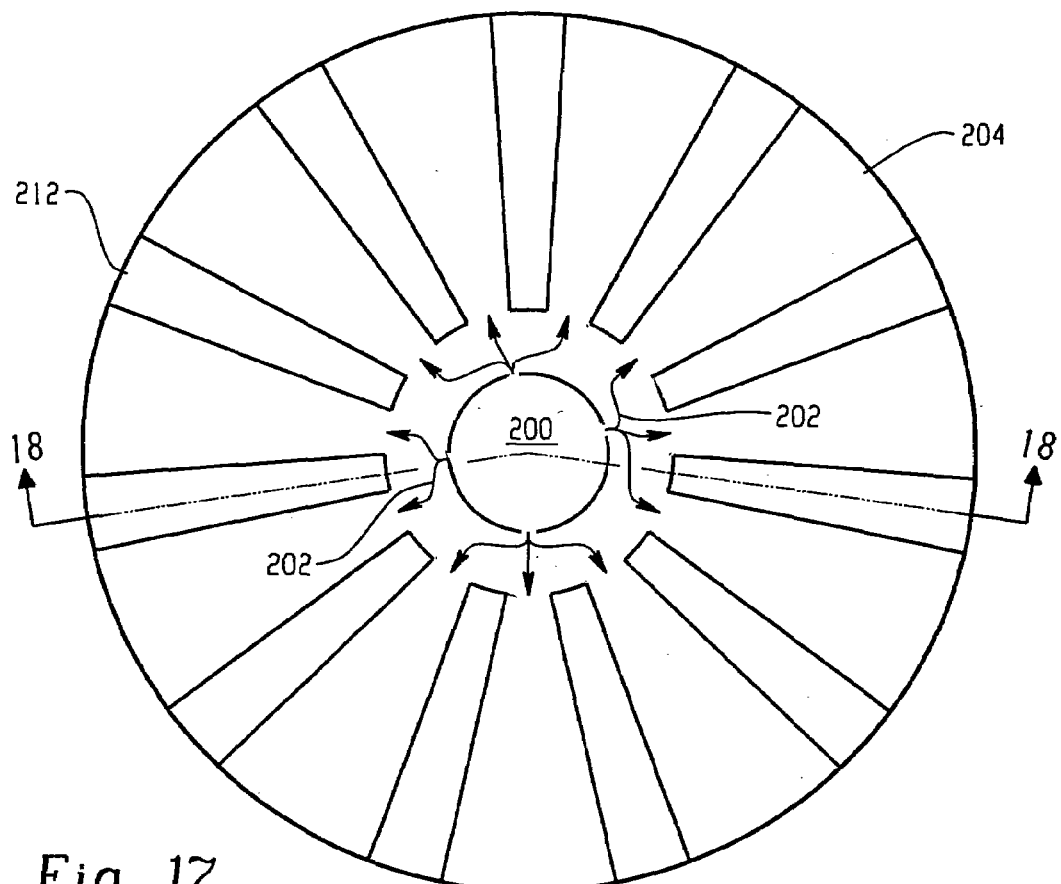
FIG. 17 illustrates a plan view of a portion of a lamp device having another alternative heat dissipation system.
Figure 18:
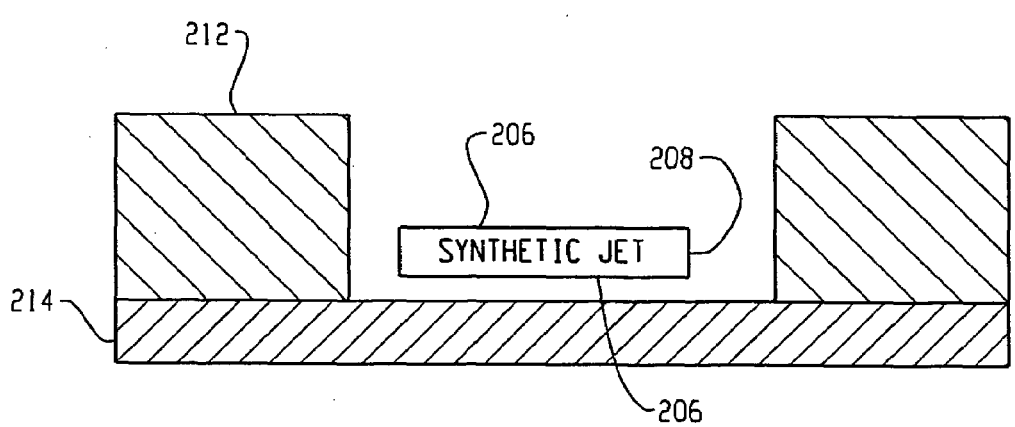
FIG. 18 illustrates a cross-section of FIG. 17 taken at line 18—18.

For example, as shown in FIG. 17, a fluid current generator 200 includes a plurality of openings 202 to cool a heat sink 204 of an LED assembly. With reference to FIG. 18, the fluid current generator 200 includes a pair of flexible side plates 206 attached to or including piezoelectric material, similar to that depicted in FIG. 8. Piezoelectric material is charged to move the flexible side plates. A flexible hinge 208 connects the pair of plates; and the flexible hinge includes the plurality of openings 202. Also, the heat sink 204 includes a plurality of fins 212 extending from a base 214 of the heat sink. The fins 212 radiate from the center of the heat sink, and the fluid current generator 200 is situated at or near the center of the heat sink. Such a configuration can be used to cool an LED array similar to array described with respect to FIGS. 1–4.

Figure 19:
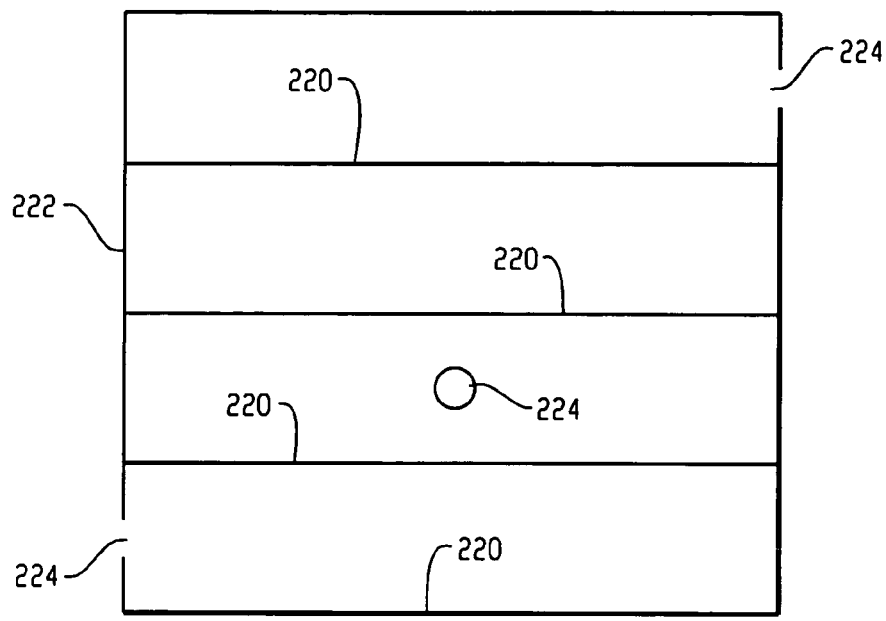
FIG. 19 illustrates a side elevation view of an alternative fluid current generator.
Figure 20:
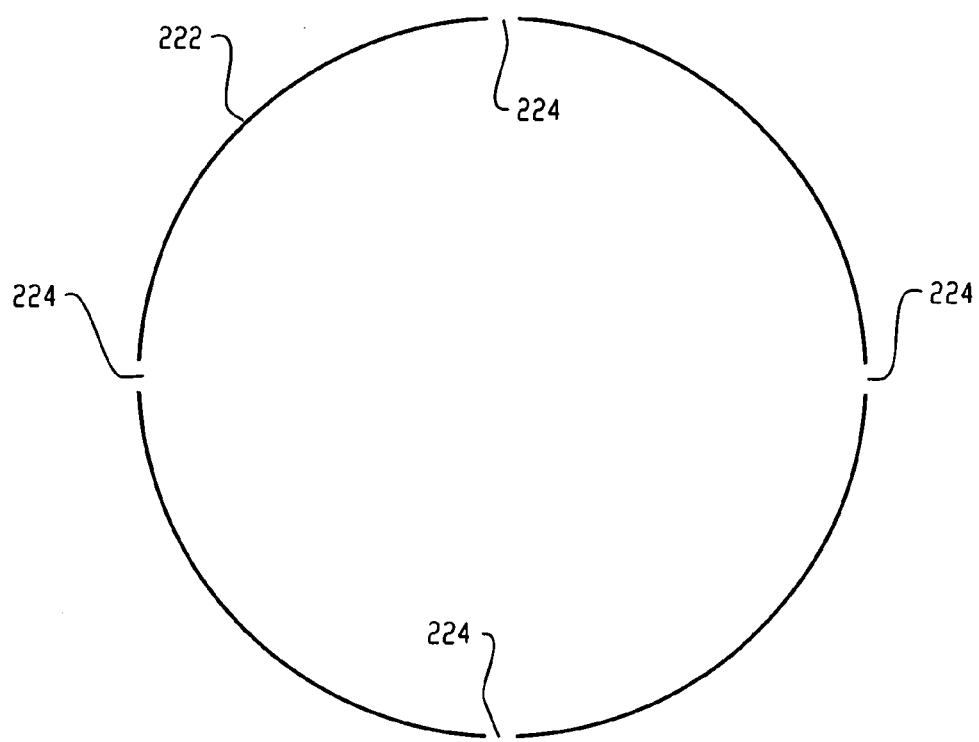
FIG. 20 illustrates a plan view of FIG. 19.

In another alternative embodiment, a plurality of synthetic jets is shown in FIGS. 19 and 20. In this embodiment, side plates 220 attach to one another by flexible hinge 222. The flexible hinge can be one contiguous piece, or it can comprise a plurality of distinct hinge pieces connecting one or two side plates together, for example. The flexible hinge can include a plurality of openings 224 that can direct current flow to different locations. For example, one opening 224 can be provided for the space between two adjacent side plates 220. Alternatively, more than one opening could be provided for such a space.

The fluid current generators described above can be used to cool portions of an LED light assembly. One fluid current generator can be used to cool one or a few LEDs. Alternatively, multiple LED systems can employ a heat sink, and the fluid current generators described above can be used to move current over the surface of the heat sink to cool the LEDs.

While the embodiments have been described with reference to such terms as "upper," "lower," "above" and the like, these terms are used for better understanding of the embodiments with respect to the orientation of the figures. These terms do not limit the scope of the invention. Furthermore, certain components of the embodiments have been described with reference to their location in comparison to other components. These descriptions should not limit the invention to only those configurations described. Preferred embodiments have been described, obviously, modifications and alterations will occur to others upon a reading and understanding the preceding detailed description. It is intended that the invention be construed as including all such modifications and alterations as so far as they come within the scope of the claims, and equivalents thereof.

The invention claimed is:

1. An LED light assembly comprising:
a housing;
an LED disposed in said housing;
a heat dissipating structure in thermal communication with said LED;
a fluid current generator disposed in said housing for creating a current over said heat dissipating structure, wherein said fluid current generator includes a piezoelectric material.

2. The assembly of claim 1, wherein said fluid current generator includes a blade comprising a flexible material, wherein the blade is spaced from a surface of said heat dissipating structure such that an unattached end of the blade can move in relation to the surface.

3. The assembly of claim 2, further comprising a pedestal extending from the surface of said heat dissipating structure, wherein the blade is attached to the pedestal such that the blade is spaced from the surface.

4. The assembly of claim 3, wherein said pedestal has a width at least equal to the width of the blade.

5. The assembly of claim 4, wherein said pedestal prevents axial current flow between the blade and the surface at an end of the blade that attaches to the pedestal.

6. The assembly of claim 2, wherein the piezoelectric material runs at least substantially the length of the blade.

7. The assembly of claim 2, further comprising a plurality of fins extending from the surface of said heat dissipating structure.

8. The assembly of claim 7, further comprising a pedestal extending from the surface, wherein the blade mounts to said pedestal.

9. The assembly of claim 8, wherein said pedestal is spaced from said plurality of fins to define a gap between said plurality of fins and said pedestal.

10. The assembly of claim 8, wherein said pedestal is adapted to prevent axial current flow between an end of the blade that is attached to said pedestal and the surface from which said pedestal extends.

11. The assembly of claim 1, wherein said heat dissipating structure includes a cavity defining an opening and said fluid current generator includes a blade attached to the heat dissipating structure, wherein the blade covers a portion of the opening.

12. The assembly of claim 11, wherein the cavity is defined by an end wall that impedes axial flow of current.

13. The assembly of claim 11, wherein said heat dissipating structure comprises a printed circuit board.

14. The assembly of claim 11, wherein the blade includes a flexible material attached to the piezoelectric material, wherein the flexible material is substantially the same length as the piezoelectric material.

15. The assembly of claim 11, wherein said heat dissipating structure includes a surface defining the opening and the blade mounts substantially flush with the surface.

16. The assembly of claim 15, wherein said fluid current generator is adapted to produce a substantially vortex shaped current around the flow path surface.

17. The assembly of claim 1, wherein said fluid current generator includes a first flexible side plate and a second flexible side plate connected by a flexible hinge.

18. The assembly of claim 17, wherein the first flexible side plate includes a first layer of piezoelectric material and a second layer of piezoelectric material.

19. The assembly of claim 18, wherein the first flexible plate includes a flexible material interposed between the first layer of piezoelectric material and the second layer of piezoelectric material.

20. The assembly of claim 17, wherein the piezoelectric material is attached to each of the first flexible side plate and the second flexible side plate.

21. The assembly of claim 17, wherein the first flexible plate, the second flexible plate and the flexible hinge define an internal cavity, said fluid current generator further including a discharge conduit in fluid communication with the internal cavity, the discharge conduit having a distal end adjacent the heat dissipating structure.

22. The assembly of claim 21, wherein the fluid current generator includes an orifice plate including an orifice in fluid communication with the distal end of the discharge conduit.

23. The assembly of claim 17, wherein the fluid current generator includes first and second orifices, wherein the first orifice is tapered.

24. The assembly of claim 23, wherein the second orifice is tapered in an opposite direction to the taper of the first orifice.

25. The assembly of claim 17, wherein said heat dissipating structure comprises a die for an LED.

26. The assembly of claim 1, wherein said fluid current generator includes a first current generator body and a second current generator body, wherein each of the current generator bodies includes a first flexible side plate and a second flexible side plate connected by a flexible hinge.

27. The assembly of claim 26, wherein said fluid current generator includes a discharge conduit in communication with a first internal cavity defined by the first flexible side plate, the second flexible side plate and the flexible hinge of the first current generator body and in communication with a second internal cavity defined by the first flexible side plate, the second flexible side plate and the flexible hinge of the second current generator body.

28. The assembly of claim 1, further comprising a plurality of fins extending from said heat dissipating structure.

29. The assembly of claim 28, wherein said fins radiate from a central point of said heat dissipating structure.

30. The assembly of claim 29, wherein said fluid current generator is positioned at or adjacent the central point of said heat dissipating structure.

31. The assembly of claim 28, wherein said fluid current generator includes a plurality of openings for creating a plurality of fluid currents.

32. The assembly of claim 28, wherein said fluid current generator includes a first plate, a second plate and a flexible hinge attaching the first plate to the second plate, wherein the flexible hinge includes a plurality of openings.

33. The assembly of claim 1, wherein said fluid current generator includes a first plate, a second plate, and a third plate, said first plate attached to said second plate by a first flexible hinge, said second plate attached to said third plate by a second flexible hinge, wherein the first flexible hinge includes an opening facing a first direction and the second flexible hinge includes an opening facing a second direction.

34. An LED light assembly comprising:
a housing;
an LED disposed in said housing;
a heat sink disposed in said housing, said LED being mounted to said heat sink and in thermal communication with said heat sink; and
a synthetic jet actuator disposed in said housing for generating a current of fluid over said heat sink to cool said LED.

35. The LED light assembly of claim 34, further comprising a plurality of LEDs disposed in said housing wherein said synthetic jet actuator is aimed to provide a current of fluid for a particular LED.

36. An LED light assembly comprising:
a heat sink;
a support mounted to said heat sink;
an LED mounted to said support, said LED conducting heat through said support and into said heat sink; and
a fluid current generator disposed for creating a current over said heat sink, wherein said fluid current generator includes a piezoelectric material.

37. The assembly of claim 36, wherein said heat sink includes a first surface to which said support attaches and a second surface that is spaced from the first surface, wherein said fluid current generator is disposed for creating a current over the second surface.

38. The light assembly of claim 36, further comprising a plurality of LEDs mounted to said support, each of said LEDs conducting heat through said support and into said heat sink.

39. An LED light assembly comprising:
a housing;
an LED disposed in said housing;
a fluid current generator disposed with respect to said LED for creating a fluid current to cool said LED, wherein said fluid current generator includes a piezoelectric material, a first flexible side plate and a second flexible side plate, the first flexible side plate and the second flexible side plate connected by a flexible hinge.

40. The assembly of claim 39, wherein said fluid current generator includes a first current generator body and a second current generator body, wherein the first current generator body comprises the first flexible side plate and the second flexible side plate connected by the flexible hinge, wherein the second current generator body includes a third flexible side plate and a fourth flexible side plate, the third flexible side plate and the fourth flexible side plate connected by a second flexible hinge.

41. The assembly of claim 39, further comprising:
a plurality of LEDs;
a support, the plurality of LEDs being mounted to said support; and
a heat sink, the support being mounted to first surface of the heat sink,
wherein the fluid current generator is disposed with respect to the heat sink such that the fluid current generator creates a current over the heat sink.

42. An LED light assembly comprising:
a housing;
an LED disposed in said housing; and
a synthetic jet actuator disposed in said housing for generating a current of fluid to cool said LED, the synthetic jet comprising a body having an fluid cavity and at least two movable elements for increasing and reducing the volume of the fluid cavity to generate the current of fluid.

* * * * *